United States Patent
Kim

(10) Patent No.: US 9,036,357 B2
(45) Date of Patent: May 19, 2015

(54) DISPLAY DEVICE AND METHOD OF MANUFACTURING THE SAME

(75) Inventor: Min-Cheol Kim, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 894 days.

(21) Appl. No.: 13/064,145

(22) Filed: Mar. 8, 2011

(65) Prior Publication Data
US 2012/0134122 A1 May 31, 2012

(30) Foreign Application Priority Data
Nov. 25, 2010 (KR) .................. 10-2010-0118170

(51) Int. Cl.
H05K 1/00 (2006.01)
H05K 1/18 (2006.01)
H05K 3/28 (2006.01)

(52) U.S. Cl.
CPC ............. H05K 1/189 (2013.01); *H05K 3/281* (2013.01); *H05K 2201/052* (2013.01); *H05K 2201/10128* (2013.01); *H05K 2201/10977* (2013.01)

(58) Field of Classification Search
USPC .......... 361/749–750, 679.06, 679.21–679.23, 361/760–763; 174/254–258
See application file for complete search history.

(56) References Cited

U.S. PATENT DOCUMENTS

| 6,781,815 | B2 * | 8/2004 | Kurumisawa | 361/302 |
| 2006/0065437 | A1 * | 3/2006 | Yumoto et al. | 174/260 |
| 2009/0213292 | A1 * | 8/2009 | Park et al. | 349/58 |
| 2009/0213534 | A1 * | 8/2009 | Sakai | 361/679.21 |
| 2009/0257181 | A1 * | 10/2009 | Ha et al. | 361/679.26 |
| 2010/0156857 | A1 * | 6/2010 | Nozaki | 345/204 |
| 2010/0165245 | A1 * | 7/2010 | Chang | 349/62 |

FOREIGN PATENT DOCUMENTS

| KR | 10 2006-0002101 A | 1/2006 |
| KR | 10 2007-0062840 A | 6/2007 |
| KR | 10 2007-0071378 A | 7/2007 |
| KR | 10 2009-0021958 A | 3/2009 |

* cited by examiner

*Primary Examiner* — Tuan T Dinh
(74) *Attorney, Agent, or Firm* — Lee & Morse, P.C.

(57) ABSTRACT

A method of manufacturing a display device includes preparing a display panel that has a display region where an image is displayed and a non-display region adjacent to the display region, and disposing a power supply flexible printed circuit board (FPCB) in a lower surface of the display panel and in the non-display region of an upper surface of the display panel. The method includes disposing a tape on the display panel to cover an upper side of the power supply FPCB disposed on the upper surface of the display panel, and attaching the tape to the display panel by performing a thermal hardening process on the tape to fix the power supply FPCB to the display panel.

19 Claims, 2 Drawing Sheets

DISPLAY DEVICE AND METHOD OF MANUFACTURING THE SAME

BACKGROUND

1. Field

Embodiments relate to a display device, and more particularly, to a display device and a method of manufacturing the same that simplifies manufacturing procedures and decreases defects.

2. Description of the Related Art

With an increasing demand for various types of display devices along with development in the information-oriented society, extensive studies on display devices, such as a liquid crystal display (LCD), a plasma panel display (PDP), a field emission display (FED), an electrophoretic display (EPD), an organic light emitting device (OLED), are being vigorously conducted.

A display device may include a display panel having a plurality of sub-pixels, a driver to provide a driving signal to the display panel, and a power supplier to provide power to the display panel and the plurality of sub-pixels. The display panel may display an image when the sub-pixels emit light having a predetermined brightness level in accordance with a data signal provided in synchronization with a scan signal.

SUMMARY

Embodiments relates to a display device that, e.g., is formed to be thin and to have uniform brightness, and a method of manufacturing the same.

Embodiments may be realized by providing a method of manufacturing a display device that includes preparing a display panel including a display region where an image is displayed and a non-display region adjacent to the display region, disposing a power supply flexible printed circuit board (FPCB) in a lower surface of the display panel and in the non-display region of an upper surface of the display panel, disposing a tape on the display panel to cover an upper side of the power supply FPCB disposed on the upper surface of the display panel, and attaching the tape to the display panel by performing a thermal hardening process on the tape to fix the power supply FPCB to the display panel.

The thermal hardening process may be performed by applying heat to the tape for three to five seconds. The thermal hardening process may be performed using a laser.

The tape may include an ultraviolet ray curable material. The tape may be disposed in the non-display region of the display panel adjacent to a long side of the display panel. The power supply FPCB may have a branched structure and includes two lateral ends in the non-display region of the upper surface of the display panel, and the tape may be coupled to the two lateral ends The tape may include a dampproof tape. The tape may be formed to have a thickness of about 0.05 mm.

Embodiments may also be realized by providing a display device that includes a display panel including a display region where an image is displayed and a non-display region adjacent to the display region, a power supply flexible printed circuit board (FPCB) disposed in a lower surface of the display panel and in the non-display region of an upper surface of the display panel, and a tape attached to the non-display region of the display panel to cover an upper side of the power supply FPCB disposed on the upper surface of the display panel.

As described above, according to exemplary embodiments of the present invention, a power supply FPCB disposed on a lower surface of a display panel may be connected to an upper surface of the display panel using a tape. As such, an application of a desiccating agent and silicon may be omitted and a time for drying the liquid may not be needed, thereby reducing a process time.

The power supply FPCB may be connected to the upper surface of the display panel just using the tape. As such, a display device may have uniform quality.

In addition, silicon does not intrude into a display region of the display panel due to just use of the tape instead of applying silicon on the power supply FPCB, so that defects may be generated less in the display device.

BRIEF DESCRIPTION OF THE DRAWINGS

Features will become more apparent to those of ordinary skill in the art by describing in detail exemplary embodiments with reference to the attached drawings in which.

DETAILED DESCRIPTION

Figure 1A:
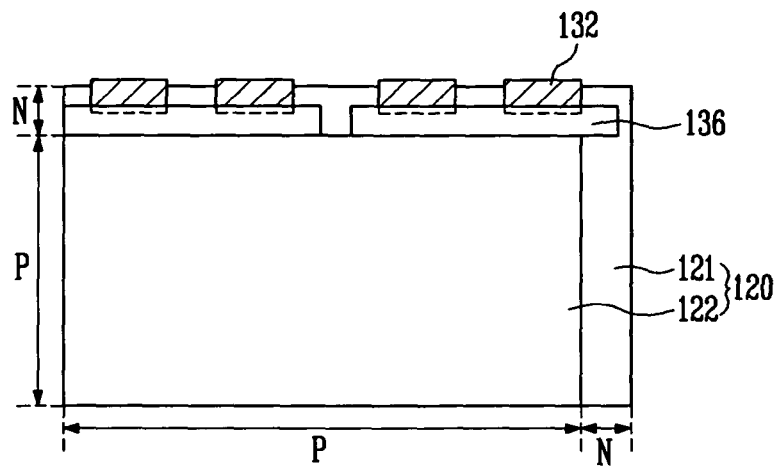
FIG. 1A illustrates a plan view of an upper surface of a display panel according to an exemplary embodiment.

Korean Patent Application 10-2010-0118170, filed on Nov. 25, 2010, in the Korean Intellectual Property Office, and entitled: "Display Device and Method of Manufacturing the same" is incorporated by reference herein in its entirety.

Hereinafter, a display device and a method of manufacturing the same according to exemplary embodiments are described with reference to the accompanying drawings.

It will be noted that shapes, sizes, ratios, angles, and numbers in the figures are schematic and may be changed. Further, the figures are illustrated from an observer's viewpoint, and thus directions and positions in the figures may be variously changed based on positions of the observer. Like reference numerals refer to like elements throughout.

It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the singular forms "a," "an" and "the" are intended to include the plural forms as well, unless the context clearly indicates otherwise. Shapes, relative sizes, and relative positions should be interpreted as encompassing a general margin of error although not defined by the terms "about" or "substantially."

It will be understood that, although the terms "after," "before," "subsequently," "then," "following," or "at this time" may be used herein, theses terms are not intended to limit chronological orders. Further, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section.

It will be understood that when an element or layer is referred to as being "on," "above," "under" or "next to" another element or layer, the element or layer can be directly on, above, under, or next to another element or layer or intervening elements or layers. In contrast, when an element is referred to as being "directly on," "directly above," "directly under" or "directly next to" another element or layer, there are no intervening elements or layers present. As used herein, the term "or" includes any and all combinations of one or more of the associated listed items, whereas the term "one of" is interpreted as including only one of the associated listed items.

Figure 1B:
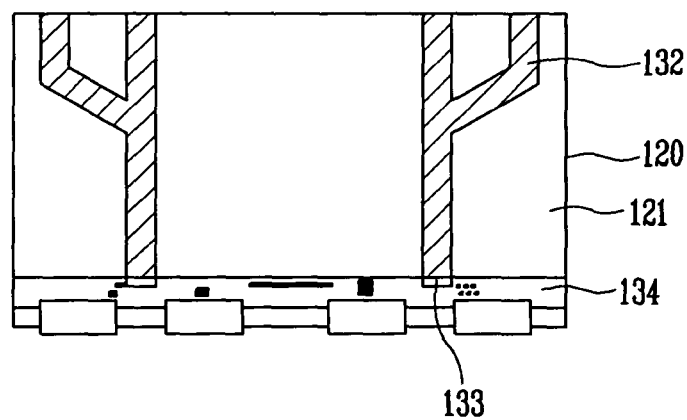
FIG. 1B illustrates a plan view of a lower surface of the display panel of FIG. 1A.

FIG. 1A illustrates a plan view of an upper surface of a display panel according to an exemplary embodiment, and FIG. 1B illustrates a plan view of a lower surface of the display panel of FIG. 1A.

Referring to FIGS. 1A and 1B, a display device according to an exemplary embodiment may include a display panel 120 configured to display an image, a printed circuit board (PCB) 134 configured to control the driving of the display panel 120 and/or to provide power to the display panel 120, and a power supply flexible PCB (FPCB) 132 disposed on the lower surface of the display panel 120.

The display panel 120 may include a front substrate 122 on which an image may be displayed, a rear substrate 121, and a plurality of sub-pixels formed in a space between the substrates. The front substrate 122 and the rear substrate 121, respectively, may have opposing long sides and opposing short sides. The opposing long sides of the front substrate 122 may be adjacent to the opposing long sides of the rear substrate. The front substrate 122 and/or the rear substrate 121 may be a glass substrate. The front substrate 122 and/or the rear substrate 121 may be a glass substrate having a rectangular plate shape.

The display panel 120 may include a display region P and a non-display region N. The non-display region N may correspond to an edge that is a surrounding area of the display region P. For example, the non-display region N may be disposed adjacent to at least one peripheral edge of the display region P. The non-display region N may include an upper non-display region N corresponding to a long side of the display panel 120, e.g., arranged adjacent to a long side of the front substrate 122. The non-display region N may include a right non-display region N corresponding to a short side of the display panel 120, e.g., arranged adjacent to a short side of the front substrate 122. The non-display region N may include both the upper non-display region N and the right non-display region N. The plurality of sub-pixels may be formed in the display region P of the display panel 120. A driving signal line (not shown) and a driving element (not shown) may be formed in the non-display region N.

The PCB 134 may be disposed on the lower surface of the display panel 120. The PCB 134 may be formed on the rear substrate 121 on a side facing away from the plurality of sub-pixels. The PCB 134 may be provided with a driving power Vdd and a common power Vcom to drive the display panel from the outside. The PCB 134 may apply the power to the display panel 120. A system circuit may be mounted on the PCB 134.

The system circuit may include a power supplier to provide power to the display panel 120, a gate driver and a data driver to provide a respective gate signal and a data signal, and a driving controller configured to control the gate signal and the data signal.

The power supplier, the gate driver, the data driver, and the driving controller may be seated on a single PCB, or may be seated on different PCBs. The PCB 134 may be disposed in a lower part of the lower surface of the display panel 120.

The power supply FPCB 132 may be provided with the driving power Vdd and/or the common power Vcom to drive the display panel 120. The power supply FPCB 132 may provide the power, e.g., the driving power Vdd and/or the common power Vcom, to the display panel 120. The power supply FPCB 132 may be disposed on the lower surface of the display panel 120 and in the upper non-display region N of the display panel 120 in an integrated form. For example, the power supply FPCB 132 may be in the lower surface of the display panel 120, and may extend along the side of the rear substrate 121 facing away from the pixel electrodes and toward an edge of the rear substrate 121. The power supply FPCB 132 may further be in the upper surface of the display panel 120, and may extend from the edge of the rear substrate 121 to an adjacent edge of the front substrate 122. The adjacent edge of the first substrate 122 may be on a side of the front substrate facing away from the plurality of pixels. The FPCB 132 may be a continuous layer that contacts, e.g., directly contacts, both the side of the rear substrate 121 facing away from the pixel electrodes and the side of the front substrate 122 facing away from the pixel electrodes.

An end of the power supply FPCB 132 may be electrically connected to the PCB 134, e.g., the PCB 134 disposed on the lower surface of the display panel 120. The power supply FPCB 132, e.g., a first end of the power supply FPCB 132, may be connected, e.g., directly connected, to the PCB 134 through a connector 133. The connector 133 may contact both the power supply FPCB 132 and the PCB 134. Another end of the FPCB 132, e.g., a second end of the FPCB 132, may be electrically connected to a power line (not shown) of the display panel 120 through a power supply pad (not shown) formed on the upper surface of the display panel 120.

The other end of the power supply FPCB 132 electrically connected to the power supply pad, may be fixed by a tape 136. The tape 136 may be a dampproof tape. The tape 136 may be disposed on the other end of the power supply FPCB 132, e.g., the second end of the FPCB 132, and may be disposed on the upper surface of the display panel 120. The tape 136 may cover lateral ends of the second end of the FPCB on the front substrate 122. The tape 136 may be attached to the upper non-display region N of the display panel 120. Accordingly to an exemplary embodiment, one tape 136 may fix two power supply FPCBs 132 in a pair. However, embodiments are not limited thereto, e.g., one tape 136 may fix more than two power supply FPCBs to the display panel 120 or may fix one power supply FPCB to the display panel 120.

A thickness of the tape 136 may be less than or equal to about 0.05 mm. Without intending to be bound by this theory, the overall thickness of the display device may be substantially increased when the thickness of the tape 136 is greater than about 0.05 mm.

The tape 136 may include a material capable of being hardened by ultraviolet rays (UV). The material capable of being hardened by UV may include, e.g., a UV curable material.

In FIGS. 1A and 1B, there are four power supply FPCBs 132, and thus two tapes 136 are used. However, a number of the tapes 136 is not limited, e.g., the number of tapes 136 may be changed based on a number of power supply FPCBs 132.

The tape 136 may be attached to the upper non-display region N of the display panel 120. The tape 136 may not protrude into the display region P of the display panel 120, so that the tape 136 may not interfere with the display region, e.g., by generating defects in the display device. The power supply FPCB 132 may be connected to the upper surface of the display panel 120, e.g., just using the tape 136, so that quality of the display device is uniform.

Hereinafter, a method of manufacturing the display device according to an exemplary embodiment is described with reference to FIGS. 2A and 2B.

Figure 2A:
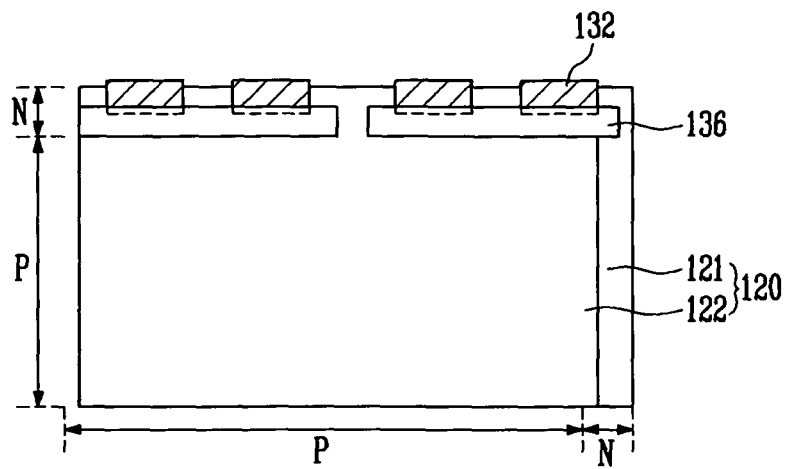
FIGS. 2A and 2B illustrate a method of manufacturing the display panel of FIG. 1A.

Referring to FIG. 2A, after the display panel 120 is prepared, the power supply FPCB 132 may be fixed in an upper non-display region N of the display panel 120 using the tape 136.

The display panel 120 may include the front substrate 122, the rear substrate 121, and the plurality of sub-pixels formed in the space between the substrates. The front substrate 122 and the rear substrate 121 may have long sides that oppose each other and short sides that oppose each other. The front substrate 122 and the rear substrate 121 may be a glass substrate having a rectangular plate shape.

The display panel 120 may include the display region P and the non-display region N. The non-display region N may correspond to an edge of the display panel 120 that is a surrounding area of the display region P. The non-display region N may include the upper non-display region N corresponding to the long side of the display panel 120, and the right non-display region N corresponding to a short side of the display panel 120. The plurality of sub-pixels may be formed in the display region P of the display panel 120, and the driving signal line (not shown) and the driving element (not shown) may be formed in the non-display region N.

The power supply FPCB 132 may be provided with the driving power Vdd and/or the common power Vcom to drive the display panel 120. The power supply FPCB 132 may apply power, e.g., the driving power Vdd and/or the common power Vcom, to the display panel 120. The power supply FPCB 132 may be disposed in the lower surface of the display panel 120 and in the upper non-display region N of the display panel 120 in an integrated form, e.g., as an integrally formed continuous layer that extends along the lower surface of the display panel 120 to the upper non-display region B of the display panel 120.

The power supply FPCBs 132 may have a single line structure or may have a branched structure. For example, the power supply FPCBs 132 may be formed as a plurality of branches of power supply FPCBs 132 in the lower surface of the display panel 120. One tape 136 may be coupled to two power supply FPCBs. One tape 136 may be coupled to a plurality of lateral ends of power supply FPCBs having a branched structure.

An end of the power supply FPCB 132 may be electrically connected to the PCB (not shown) disposed on the lower surface of the display panel 120, and another end thereof may be electrically connected to a power line (not shown) of the display panel 120 through a power supply pad (not shown) formed on the upper surface of the display panel 120.

The other end of the power supply FPCB 132, e.g., a second lateral end of the power supply FPCB 132, may be fixed to the upper non-display region N of the display panel 120 by the tape 136. The tape 136 may be disposed along the other end of the power supply FPCB 132 on the upper surface to be attached to the upper non-display region N of the display panel, so that the other end of the power supply FPCB may be fixed to the upper non-display region N of the display panel 120.

The tape 136 may be a dampproof tape. The tape 136 may minimize, reduce, and/or prevent moisture from infiltrating into the power supply FPCB 132. The tape 136 may also minimize, reduce, and/or prevent moisture from infiltrating into the power supply pad. One tape 136 may have a sufficient length in order to cover two ends of power supply FPCBs 132. As such, one tape 136 may fix two power supply FPCBs 132 in a pair to the upper non-display region N of the display panel 120.

A thickness of the tape 136 may be less than or equal to about 0.05 mm. Without intending to be bound by this theory, the display device may be thick when the thickness of the tape 136 is greater than about 0.05 mm. The display device may be thin when the thickness is less than about 0.05 mm.

The tape 136 may be disposed in the non-display region, e.g., the upper non-display region N, of the display panel adjacent to a long side of the front substrate 122. The tape 136 may extend in a direction parallel to the long side of the front substrate 122. For example, a long side of the tape 136 may extend in a direction parallel to the long side of the front substrate 122, so that the tape 136 may fix a plurality of power supply FPCBs 132 to the upper non-display region N of the display panel.

The tape 136 may include a material hardened by UV. The material hardened by UV may include, e.g., a UV curable material and/or a generally known UV curable material.

Figure 2B:
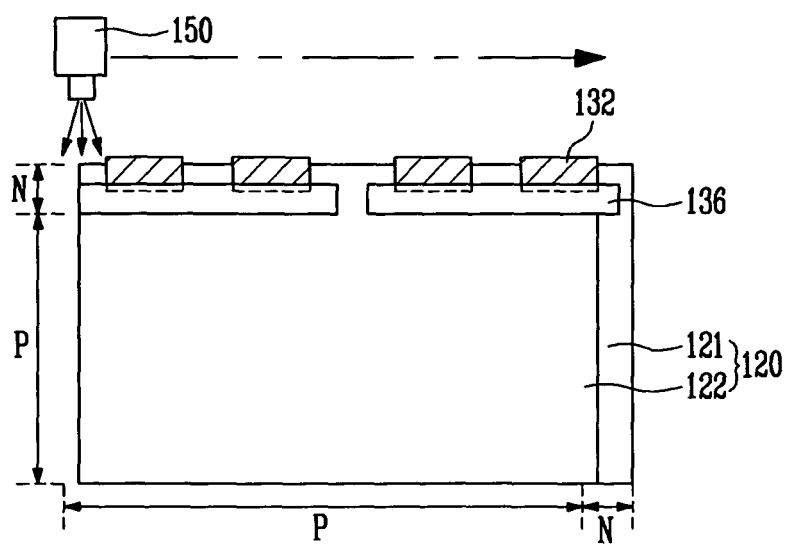

In FIGS. 2A and 2B, there are four power supply FPCBs 132, and thus two tapes 136 are used. However, a number of tapes 136 is not limited, e.g., the number of tapes 136 may be changed based on a number of power supply FPCBs 132.

Referring to FIG. 2B, the tape 136 may be stuck to the display panel 120 by performing a hardening process, e.g., a thermal hardening process. The hardening process may be performed by applying energy, e.g., heat, to the tape 136 for three to five seconds using a laser 150. Without intending to be bound by this theory, when heat application to the tape 136 is performed for less than three seconds, the tape 136 may not be substantially, e.g., completely, stuck to the display panel 120. When heat application is performed for more than five seconds, the power supply FPCB 132 and/or a polarizing plate (not shown) of the display panel 120 may be damaged. Therefore, according to an exemplary embodiment, the thermal hardening process is performed through heat application to the tape 136 for three to five seconds.

Without intending to be bound by these theory, according to exemplary embodiments, the power supply FPCB 132 may be easily attached to the display panel 120 using the tape 136, e.g., without an application of a desiccating agent and silicon. Since the application of substances, e.g., a desiccating agent and silicon, may be omitted, a time for drying the solution may be reduced. Accordingly, a procedure may become simpler, e.g., simplified from two processes to one process. The power supply FPCB 132 may be connected to the upper surface of the display panel 120 simply using the tape 136 regardless of a worker or worker's skills, and thus quality of the display device may be uniform. Further, the tape 136 may be attached to the upper non-display region N of the display panel 120, so as not to protrude into the display region P of the display panel 120, so that defects may be generated less in the display device.

By way of summation and review, the pixel power of the display device may determine light emitting brightness of the sub-pixels based on data signal. Thus, in order to display an image having uniform quality, pixel power having the same voltage may be supplied to the corresponding sub-pixels. However, the pixel power may be direct current power having a predetermined voltage level, and thus a voltage drop (IR Drop) may occur while the power travels along a power line.

In particular, the larger the display panel of the display device becomes, the longer the power line is. Accordingly, a difference in brightness between pixels may worsen depending on, e.g., a distance from a power pad provided with the pixel power. A separate flexible printed circuit board (FPCB) for power supply to an upper portion of the display panel may be used in order to decrease a brightness difference between pixels.

In an exemplary embodiment of connecting the FPCB for power supply to the upper portion of the display panel, the FPCB for power supply is pressed on a pad on the display panel and an application of a desiccating agent and silicon is performed thereto. Since the desiccating agent and silicon are liquid, a period of time for drying is needed after the application of the desiccating agent and silicon, and accordingly an entire process time may increase by at least the drying time.

Further, in the application of silicon, an applied range and height may be different depending on a worker or worker's skills. As such, a quality may not be uniform. Moreover, silicon may be applied to intrude into a display region of the display panel to cause a defect in the display device.

In another exemplary embodiment of connecting the FPCB for power supply to the upper portion of the display panel, the tape 136 may be used. The tape 136 may be stuck, e.g., fixed and/or attached, to the display panel 120 by performing a hardening process, e.g., a thermal hardening process.

A display device may be classified into a passive matrix type and an active matrix type. At least an active matrix display device may include sub-pixels arranged in a matrix form. The active matrix display may have excellent resolution and superior ability of implementing videos as compared with a passive matrix display device.

Exemplary embodiments have been disclosed herein. While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof. Accordingly, it will be understood by those of ordinary skill in the art that various changes in form and details may be made without departing from the spirit and scope of the present invention as set forth in the following claims.

What is claimed is:

1. A method of manufacturing a display device, the method comprising:
   preparing a display panel having an upper surface including a display region where an image is displayed and a non-display region adjacent to the display region;
   disposing a power supply flexible printed circuit board (FPCB) on a lower surface of the display panel and in the non-display region of the upper surface of the display panel;
   disposing a tape on the display panel to cover an upper side of the power supply FPCB disposed on the upper surface of the display panel;
   disposing a printed circuit board (PCB) on the lower surface of the display panel to control driving of the display panel; and
   attaching the tape to the display panel by performing a thermal hardening process on the tape to fix the power supply FPCB to the display panel.

2. The method of claim 1, wherein the thermal hardening process is performed by applying heat to the tape for three to five seconds.

3. The method of claim 1, wherein the thermal hardening process is performed using a laser.

4. The method of claim 1, wherein the tape includes an ultraviolet ray curable material.

5. The method of claim 1, wherein the tape is disposed in the non-display region of the display panel and is adjacent to a long side of the display panel.

6. The method of claim 1, wherein the power supply FPCB has a branched structure and includes two lateral ends in the non-display region of the upper surface of the display panel, and the tape is coupled to the two lateral ends.

7. The method of claim 1, wherein the tape is a dampproof tape.

8. The method of claim 1, wherein the tape is formed to have a thickness of about 0.05 mm.

9. A display device, comprising:
   a display panel having an upper surface including a display region where an image is displayed and a non-display region adjacent to the display region;
   a power supply flexible printed circuit board (FPCB) on a lower surface of the display panel and in the non-display region of the upper surface of the display panel;
   a driving printed circuit board (PCB) electrically connected to the power supply FPCB through a connector; and
   a tape attached to the non-display region of the display panel to cover an upper side of the power supply FPCB on the upper surface of the display panel.

10. The display device of claim 9, wherein the tape includes an ultraviolet ray curable material.

11. The display device of claim 9, wherein the tape is arranged in the non-display region of the display panel and is adjacent to a long side of the display panel.

12. The display device of claim 9, wherein the power supply FPCB has a branched structure and includes two lateral ends in the non-display region of the upper surface of the display panel, and the tape is coupled to the two lateral ends.

13. The display device of claim 9, wherein the tape is a dampproof tape.

14. The display device of claim 9, wherein the tape has a thickness of about 0.05 mm.

15. The display device of claim 9, wherein the power supply FPCB is formed in an integrated form on the lower surface and the upper surface of the display panel.

16. The display device of claim 9, wherein the driving PCB is disposed on the lower surface of the display panel.

17. The display device of claim 9, wherein an end of the power supply FPCB is electrically connected to the driving PCB.

18. The display device of claim 16, wherein the driving PCB is disposed in a lower part of the lower surface of the display panel.

19. A display device, comprising:
   a display panel including a display region where an image is displayed and a non-display region adjacent to the display region;
   a power supply flexible printed circuit board (FPCB) on a lower surface of the display panel and in the non-display region of an upper surface of the display panel;
   a tape attached to the non-display region of the display panel to cover an upper side of the power supply FPCB on the upper surface of the display panel; and
   a driving printed circuit board (PCB) configured to control driving of the display panel,
   wherein an end of the power supply FPCB is electrically connected to the driving PCB, and the power supply FPCB and the driving PCB are electrically connected through a connector.

* * * * *